United States Patent
Arai et al.

[11] Patent Number: 6,122,159
[45] Date of Patent: Sep. 19, 2000

[54] ELECTROSTATIC HOLDING APPARATUS

[75] Inventors: Kenichi Arai; Yoshihiro Kubota, both of Gunma-ken, Japan

[73] Assignee: Shin Etsu-Chemical Co., Ltd., Tokyo, Japan

[21] Appl. No.: 09/209,703

[22] Filed: Dec. 10, 1998

[30] Foreign Application Priority Data

Dec. 12, 1997 [JP] Japan .................................. 9-362824

[51] Int. Cl.$^7$ .................................................. H01T 23/00
[52] U.S. Cl. ............................................ 361/234; 279/128
[58] Field of Search ................... 361/230–235; 279/128

[56] References Cited

U.S. PATENT DOCUMENTS

| 5,382,469 | 1/1995 | Kubota et al. | 361/234 |
| 5,792,562 | 8/1998 | Collins et al. | 361/230 |
| 5,909,354 | 6/1999 | Harada et al. | 361/234 |
| 5,985,813 | 9/1999 | Aida et al. | 279/128 |

FOREIGN PATENT DOCUMENTS 402022166  1/1990  Japan .

*Primary Examiner*—Michael J. Sherry
*Attorney, Agent, or Firm*—Hogan & Hartson, LLP

[57] ABSTRACT

An electrostatic holding apparatus in which a voltage is applied to an conductive electrode covered with an insulating dielectric layer, in order to cause the insulating dielectric layer to electrostatically attract an object. The insulating dielectric layer is substantially formed of a sintered body produced by addition of 2.5–5 wt. % titania ($TiO_2$) and 5 wt. % or less titanium nitride (TiN) powder to powder of a high resistivity ceramic having a volume resistivity of $1 \times 10^{14}$ $\Omega \cdot cm$ or higher at 25° C., followed by kneading, forming, and sintering. The sintered body has a volume resistivity of $1 \times 10^8$–$8 \times 10^{13}$ $\Omega \cdot cm$ at 25° C. The volume resistivity of the insulating dielectric layer is decreased so as to increase an electrostatic attraction force, and an object can be removed at the time of stopping application of voltage. Further, the electrostatic holding apparatus does not generate impurities that would otherwise contaminate semiconductor devices. In addition, neither fine cracks nor pores remain, so that the electrostatic holding apparatus excellent in terms of withstand voltage.

2 Claims, 1 Drawing Sheet

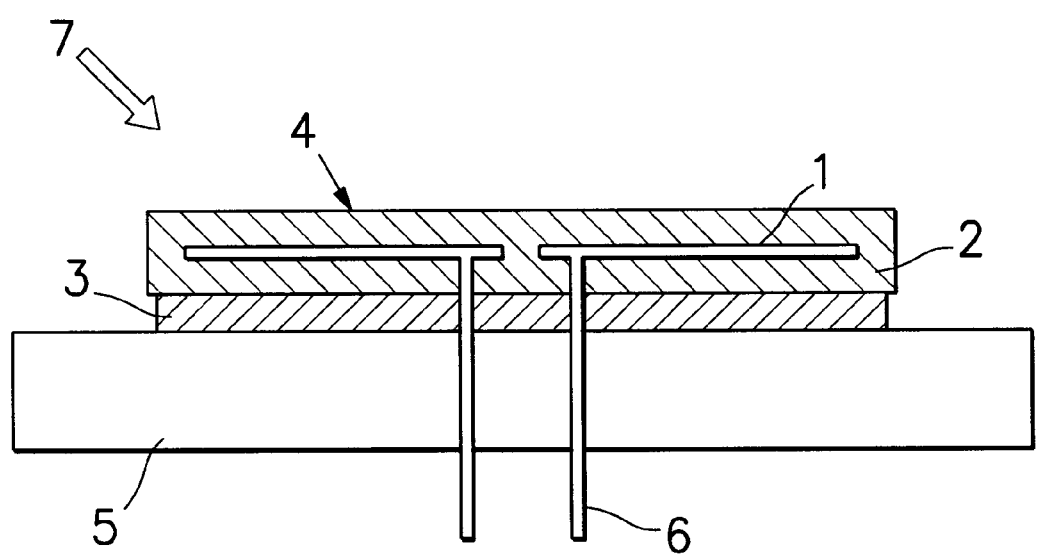

ELECTROSTATIC HOLDING APPARATUS

BACKGROUND OF THE INVENTION

1. Field of the Invention

The present invention relates to an electrostatic holding apparatus, and more particularly to an electrostatic holding apparatus useful for a process performed during fabrication of semiconductor devices, liquid-crystal devices, etc., which apparatus can strongly attract and hold a conductive, semiconductive, or insulating object by means of electrostatic force at any temperature ranging from a low temperature to a high temperature and which enables easy attachment/detachment of the object.

2. Description of the Related Art

Recently, processes for fabricating semiconductor devices, liquid-crystal devices, etc.; especially processes of drying etching, ion implantation and vapor deposition, have been more and more automated and performed as dry processes. Under such circumstances, the number of fabrication processes performed under vacuum has increased.

Meanwhile, positional accuracy at the time of patterning has become more important since the diameters of silicon wafers and glass plates serving as substrates have increased and the degree of integration of circuits and the degree of fineness of patterns have increased. Therefore, vacuum chucks have been used to transport wafers or to attract and fix wafers. However, vacuum chucks have the following drawbacks. Vacuum chucks cannot be used under a vacuum environment because of impossibility of creating a pressure difference. Although vacuum chucks can be used under a non-vacuum environment, a sucked wafer undergoes a local distortion because the wafer is sucked locally, with the result that accurate positioning becomes difficult. Therefore, vacuum chucks are not suitable for recently developed processes for fabricating semiconductor devices and liquid-crystal devices.

Recently, as a device that has overcome the above-described drawbacks, there has been widely noticed and put into practical use an electrostatic holding apparatus which transports and/or attracts and fixes a wafer by means of electrostatic force. In a recent process for fabricating semiconductor devices and liquid-crystal devices, with an increase in the degree of fineness of devices, the flatness of wafers and glass plates serving as substrates has become more and more important. Therefore, employment of electrostatic holding apparatuses has been considered in order to perform a straightening correction for improving the flatness of wafers and glass plates.

Such a straightening correction for improving the flatness of wafers and glass plates requires a very strong electrostatic force. In order to meet such a requirement, there has been proposed a technique in which titania ($TiO_2$) is mixed into an insulating material such as alumina in order to decrease the volume resistivity to thereby increase the electrostatic attraction force (see Japanese Patent Application Laid-Open (kokai) Nos. 62-94953, 2-206147, 3-147843, and 3-204924).

As described above, when alumina containing titania is used for an insulating dielectric layer of an electrostatic attraction portion, the volume resistivity of the insulating dielectric layer decreases and a weak current flows therethrough, so that an increased electrostatic force is generated due to the Johnson-Rahbek effect. However, since titania is a semiconducting substance, movement velocity of charges decreases, so that even when the volume resistivity is optimized, the response characteristics (time required for reaching saturated attraction force, time required for annihilation of residual attraction force) at the time of stopping application of voltage deteriorate. Consequently, an article becomes difficult to remove from the attraction surface of the electrostatic holding apparatus. This deterioration in the response characteristics becomes remarkable when the electrostatic holding apparatus is used at low temperature.

Decreasing the volume resistivity of the insulating dielectric layer to, for example, $1\times10^8$ $\Omega \cdot cm$ requires addition of about 25 wt. % $TiO_2$; however, $TiO_2$ must not be incorporated, as an impurity, into semiconductor devices during a process of fabricating the semiconductor devices. When the temperature of a semiconductor wafer to be held is equal to or higher than room temperature the volume resistivity of the wafer is excessively low, so that a strong leakage current flows from a holding apparatus to the wafers, resulting in breakage of circuits formed on the wafer.

Further, due to a difference in coefficient of thermal expansion between titania and alumina, cracks and/or pores are generated in sintered alumina, so that the withstand voltage is low.

SUMMARY OF THE INVENTION

The present invention has been accomplished to solve the above-mentioned problems, and an object of the present invention is to provide an electrostatic holding apparatus in which an insulating dielectric layer of an electrostatic attraction portion contains a minimal amount of an impurity that causes damage to semiconductor devices; in which the volume resistivity of the insulating dielectric layer is decreased so as to increase an electrostatic attraction force; which allows easy removal of an object at the time of stopping application of voltage; and in which neither fine cracks nor pores remain, therefore making the electrostatic holding apparatus excellent in terms of withstand voltage.

To achieve the above object, the present invention provides an electrostatic holding apparatus in which a voltage is applied to an conductive electrode covered with an insulating dielectric layer, in order to cause the insulating dielectric layer to electrostatically attract an object, wherein the insulating dielectric layer is substantially formed of a sintered body produced by addition of 2.5–5 wt. % titania ($TiO_2$) and 5 wt. % or less titanium nitride (TiN) powder to powder of a high resistivity ceramic having a volume resistivity of $1\times10^{14}$ $\Omega \cdot cm$ or higher at 25° C., followed by kneading, forming, and sintering, the sintered body having a volume resistivity of $1\times10^8$–$8\times10^{13}$ $\Omega \cdot cm$ at 25° C.

When the insulating dielectric layer is substantially formed of a sintered body produced by addition of 2.5–5 wt. % titania ($TiO_2$) and 5 wt. % or less titanium nitride (TiN) powder to powder of a high resistivity ceramic having a volume resistivity of $1\times10^{14}$ $\Omega \cdot cm$ or higher at 25° C., followed by kneading, forming, and sintering, the electrical characteristics of the sintered body are stabilized, because oxynitride is formed between $TiO_2$ and TiN or between $Al_2O_3$ and TiN within the sintered body or grain boundaries; thus, the volume resistivity of the insulating dielectric layer at 25° C. can be controlled easily and precisely to fall within the range of $1\times10^8$–$8\times10^{13}$ $\Omega \cdot cm$; and movement velocity of charges is increased as compared to the case where solely $TiO_2$ is added. Accordingly, it becomes possible to form an electrostatic attraction portion which produces a strong and uniform electrostatic force; which responds more quickly in operations of attachment and removal of an object while facilitating removal of the object; which has a reduced coefficient of thermal expansion; and in which neither fine cracks nor pores remain in the insulating dielectric layer after sintering, therefore imparting the electrostatic attraction portion with a high withstand voltage.

Preferably, the high resistivity ceramic is a ceramic material selected from the group consisting of alumina, aluminum nitride, and zirconium oxide; or a mixture of two or more kinds of ceramic materials selected from the group.

When the ceramic of the insulting dielectric layer is selected from the above-described group, addition of the above-described $TiO_2$ and TiN to the ceramic enables an increase in electrostatic attraction force and enhancement of heat resistance and plasma resistance. Further, since the difference in coefficient of thermal expansion between the ceramic and $TiO_2$ and TiN mixed therein can be decreased to a possible extent, neither distortions nor cracks are generated in the attraction surface of the electrostatic attraction portion after a sintering process, so that the withstand voltage characteristic is improved. As a result, generation of defects such as distortions and cracks is reliably prevented in a substrate (e.g., semiconductor wafer or glass plate) that is attracted and held by means of the electrostatic holding apparatus.

As described above, in the electrostatic holding apparatus according to the present invention, the insulating dielectric layer of the electrostatic attraction portion for attracting an object is substantially formed of a sintered body produced by addition of 2.5–5 wt. % titania ($TiO_2$) and 5 wt. % or less titanium nitride (TiN) powder to powder of a high resistivity ceramic having a volume resistivity of $1 \times 10^{14}$ Ω·cm or higher, followed by kneading, forming, and sintering, and the volume resistivity of the sintered body is controlled to fall within the range of $1 \times 10^8$–$8 \times 10^{13}$ Ω·cm. Accordingly, the electrostatic holding apparatus produces a strong and uniform electrostatic force, exhibits excellent responsiveness in attraction and removal of an object, and causes little damage to semiconductor devices, because of reduction in the amount of impurities. Further, since the coefficient of thermal expansion of the insulating dielectric layer is low, neither fine cracks nor pores remain in the insulating dielectric layer after sintering, so that the electrostatic holding apparatus provides high performance and has excellent characteristics, including high withstand voltage. Therefore, the electrostatic holding apparatus of the present invention has great industrial utility.

BRIEF DESCRIPTION OF THE DRAWINGS

The sole FIGURE is a vertical cross-sectional view showing an example of an electrostatic holding apparatus according to the present invention.

DESCRIPTION OF THE PREFERRED EMBODIMENT

An embodiment of the present invention will next be described in detail; however, the embodiment should not be construed as limiting the invention.

The inventors of the present invention considered that the material of an insulating dielectric layer of an electrostatic holding apparatus must be changed in order to solve the problems involved in conventional electrostatic holding apparatuses; i.e. the problem that although a strong electrostatic attraction force is generated, attraction and removal of an object cannot be performed smoothly, and the problem that addition of $TiO_2$ results in an increase in the amount of impurities incorporated into semiconductor devices during a process of fabricating the semiconductor devices. Based on the above-described consideration, the inventors conceived that if the material of the insulating dielectric layer is changed to a ceramic containing a specific amount of $TiO_2$ and TiN, there can be manufactured a long-life and high-performance electrostatic holding apparatus which generates a strong electrostatic attraction force, which enables smooth and proper attraction and removal of an object, and in which neither fine cracks nor pores are generated in the insulating dielectric layer, which would otherwise decrease the withstand voltage. The present invention was achieved on the basis of this concept and through thorough investigations of other conditions.

The sole FIGURE shows a vertical cross-sectional view of an electrostatic holding apparatus 7 according to the present invention.

The electrostatic holding apparatus 7 includes an electrostatic attraction portion 4 bonded to the top surface of a plate portion 5 via an adhesive layer 3. The electrostatic attraction portion 4 has a plate-like structure such that a bipolar electrode 1 is coated with an insulating dielectric layer 2. When a voltage from an external power supply is applied to the electrode 1 via lead wires 6, an electrostatic force is generated between the top surface of the electrostatic attraction portion 4 and an object (e.g., a semiconductor wafer) placed thereon. Thus, the object is held strongly, while straightening correction is performed to improve the flatness of the object.

The insulating dielectric layer 2—which constitutes the electrostatic attraction portion 4—is substantially formed of a sintered body produced by addition of 2.5–5 wt. % titania ($TiO_2$) and 5 wt. % or less titanium nitride (TiN) powder to powder of a high resistivity ceramic having a volume resistivity of $1 \times 10^{14}$ Ω·cm or higher, followed by kneading, forming, and sintering. The sintered body preferably has a volume resistivity of $1 \times 10^8$–$8 \times 10^{13}$ Ω·cm at 25° C.

When the sintered body is manufactured by use of the above-mentioned composition, oxynitride is formed between $TiO_2$ and TiN or between $Al_2O_3$ and TiN within the sintered body or grain boundaries, so that the electrical characteristics of the sintered body are stabilized. As a result, the volume resistivity of the insulating dielectric layer at 25° C. can be controlled easily and precisely to fall within the range of $1 \times 10^8$–$8 \times 10^{13}$ Ω·cm; and movement velocity of charges is increased as compared to the condition where solely $TiO_2$ is added. Accordingly, there can be formed an electrostatic attraction portion 4 which produces a strong and uniform electrostatic force, while enabling easy attraction and removal of an object; which has a reduced coefficient of thermal expansion; and in which neither fine cracks nor pores remain in the insulating dielectric layer after sintering, therefore imparting the electrostatic attraction portion with a high withstand voltage.

As described above, in the conventional technique, a few wt % to 25 wt. % titania ($TiO_2$) is mixed into alumina ($Al_2O_3$) in order to adjust the volume resistivity of the insulating dielectric layer at room temperature to fall within the range of $10^9$–$10^{11}$ Ω·cm, thereby increasing the electrostatic force. However, since titania is a semiconductor substance, movement velocity of charges decreases, so that even when the volume resistivity is optimized, there occurs deterioration of the response characteristics (time required for attaining maximum attraction force, time required for dissipation of residual attraction force) at the time of stopping application of voltage. Consequently, an article becomes difficult to remove from the attraction surface of the electrostatic holding apparatus. Further, due to a difference in coefficient of thermal expansion between titania and alumina, fine cracks and/or pores are generated in sintered alumina, so that the withstand voltage becomes low.

In view of the foregoing, the present inventors investigated and searched for a compound, other than titania, which can be used as an additive for decreasing the volume resistivity of ceramic to a proper value and found that addition of $TiO_2$ and TiN to the ceramic is very effective for this purpose. Further, the inventors obtained the relationship between the incorporation amount of the additive and the volume resistivity of ceramic and confirmed that addition of $TiO_2$ and TiN in proper amounts yields a ceramic having physical properties suitable for the electrostatic attraction portion, and further investigated effects of the additives on semiconductor wafers. Thus, ceramic having the above-described composition was prepared.

For the ceramic of the insulting dielectric layer 2 of the electrostatic attraction portion 4, a high resistivity ceramic powder having a volume resistivity at 25° C. of $1\times10^{14}$ Ω·cm or higher is suitable, and there can be used a ceramic material selected from the group consisting of aluminum oxide (alumina), aluminum nitride, and zirconium oxide; or a mixture of two or more kinds of ceramic materials selected from the group.

In the present invention, $TiO_2$ and TiN are mixed into the above-described ceramic material or materials in order to adjust the volume resistivity to a desired value, so that there can be formed an insulating dielectric layer that generates a strong electrostatic force.

A proper value of the volume resistivity of the insulting dielectric layer 2—which constitutes the electrostatic attraction portion 4—varies depending on the temperature of use. For example, if the temperature of a semiconductor wafer to be held is 25° C. or less, a sufficiently strong electrostatic force is generated and device damage does not occur if the volume resistivity of the insulating dielectric layer falls within the range of $1\times10^8$–$1\times10^{12}$ Ω·cm.

The volume resistivity (at 25° C.) of the insulating dielectric material for the electrostatic chuck is preferably adjusted to fall within the range of $1\times10^8$–$8\times10^{13}$ Ω·cm, more preferably within the range of $1\times10^{10}$–$1\times10^{12}$ Ω·cm. When the incorporation amount of $TiO_2$ is less than 2.5 wt. % or TiN is not added, the volume resistivity does not decrease sufficiently, so that the electrostatic force becomes too weak and therefore a wafer cannot be held. When the incorporation amount of $TiO_2$ exceeds 5 wt. % or that of TiN exceeds 5 wt. %, the volume resistivity decreases excessively, so that the electrostatic force becomes excessively strong and therefore damage is generated in the wafer. Accordingly, the incorporation amount of $TiO_2$ is determined to be within the range of 2.5 to 5 wt. % and the incorporation amount of TiN is determined to be within the range of 5 wt. % or less.

When the insulating dielectric layer is fabricated under the above-described conditions; i.e., the insulating dielectric layer is mainly formed of ceramics containing $TiO_2$ and TiN, oxynitride is formed between $TiO_2$ and TiN or between $Al_2O_3$ and TiN within the sintered body forming the insulating dielectric layer or grain boundaries, so that the electrical characteristics of the sintered body are stabilized, thus enabling the electrostatic attraction portion to be formed of the sintered body having a volume resistivity of $1\times10^8$–$8\times10^{13}$ Ω·cm at 25° C. Thus, movement velocity of charges is increased as compared to the case where solely $TiO_2$ is added. As a result, a strong and uniform electrostatic force can be generated, and the attraction force becomes zero immediately after stoppage of application of voltage, so that a wafer can be easily removed. Therefore, the responsiveness in electrostatic attraction and release is quite good.

The electrostatic force is generally represented by the following equation:

$$F = A \cdot \epsilon \cdot (V/t)^2$$

where F: electrostatic force (C), $\epsilon$: dielectric constant (F/m), V: applied voltage (V), t: thickness ($\mu$m), and A: constant. Ceramic powder having a high dielectric constant such as barium titanate, lead titanate, zirconium titanate, PLZT (lead zirconate titanate lantern), silica, and magnesia may be added, as an additional component, to the insulating material in an amount that does not cause damage to semiconductor devices to be held.

The electrostatic attraction portion 4 is prepared as follows. First, a binder and a solvent are mixed into ceramic powder to form a green sheet. Screen printing is then performed to print an electrode 1 on one surface of the green sheet through use of metal powder paste. Subsequently, a different green sheet is superposed on the green sheet and is unified therewith through application of pressure by means of a high-pressure press, followed by sintering at a high temperature. Thus, a sintered body is obtained. Finally, opposite sides of the sintered body are precisely polished to obtain a plate-shaped electrostatic attraction portion 4. Alternatively, a metallic plate or conductive ceramic sheet is prepared as the electrode 1, and insulating ceramic is thermal-sprayed on both sides thereof to a desired thickness in order to form a plate shape, both sides of which are then polished accurately to complete the electrostatic attraction portion 4. The conductive electrode 1 that constitutes the electrostatic attraction portion 4 is formed of a material selected from a group consisting of metals such as aluminum, iron, copper, silver, gold, titanium, tungsten, molybdenum, and platinum, and conductive ceramics such as graphite, carbon, silicon carbide, titanium nitride, and titanium carbide, or an alloy of two or more materials selected from the group, or a mixed sintered body of these materials.

A screen printing method, a spraying and fusing method, a photo-lithography method, a plating method, or the like is used to form the electrode 1. In order to form an attraction electric field, there may be used a monopolar type electrode in which an object to be attracted is used as one electrode, and the other electrode is placed within the electrostatic attraction portion 4, or a bipolar type electrode in which two electrodes are placed within the electrostatic attraction portion 4.

Since voltage must be applied to the internal electrode 1 in order to generate an electrostatic force at the electrostatic attraction portion 4, holes communicating with the internal electrode 1 are formed in the ceramic which covers the electrode, and lead wires are connected from the external power supply to the electrode 1. When the electrode is formed of a solderable material such as copper, platinum, or nickel-plated or gold-plated tungsten, the lead wires are soldered to the electrode through use of solder having a melting point higher than the operating temperature of the electrostatic chuck. When the electrode is formed of an insolderable material such as graphite, tungsten, or titanium nitride, threaded pins are formed of an alloy having a coefficient of thermal expansion equal to that of the ceramic, and the pins are inserted to the holes and silver-brazed to the electrodes.

Since the electrostatic attraction portion 4 has a thin-plate like shape and is easily broken, the plate portion 5 must serve as a reinforcing plate. Also, the plate portion 5 must have a high heat conductivity in order to effectively radiate heat and must have a small coefficient of thermal expansion so as not to impart distortion or warp to the electrostatic attraction portion 4. Therefore, the plate portion 5 is preferably formed of a material selected from the group of consisting of aluminum oxide, aluminum nitride, silicon nitride, silicon oxide, zirconium oxide, titanium oxide, sialon, boron nitride, and silicon carbide, or a mixed sintered material of two or more kinds of materials selected from the group. There can be used a laminated plate obtained through integration of the above ceramic plate and a metallic plate such as an Al plate, Cu plate, or Ti plate, or an alloy plate such as a stainless plate.

Generally, a thermosetting synthetic resin adhesive having a high heat resistance is used for bonding between the electrostatic attraction portion 4 and the plate portion 5. If an adhesive that is in a liquid state at room temperature is used, the electrostatic attraction portion 4 and the plate portion 5 can be joined uniformly and easily, and adhesive bonding becomes usable regardless of the shapes of the electrostatic attraction portion 4 and the plate portion 5. Various application methods such as spin coating, bar coating, and spray coating may be used for application of the liquid adhesive.

EXAMPLES

The present invention will now be described by way of example. However, the present invention is not limited thereto.

Example $TiO_2$ powder (2.5 parts by weight), TiN powder (1.5 parts by weight), butyral resin (8 parts by weight), ethanol (60 parts by weight), and dioctyl phthalate (10 parts by weight) were added to 100 parts by part of a ceramic mixture of 93 wt. % alumina ($Al_2O_3$) powder, 4 wt. % silica powder, and 3 wt. % magnesia, and the resultant mixture was then kneaded in a ball mill for 24 hours to yield slurry.

The slurry was then treated by a vacuum debubbling machine, and a fraction of the solvent was evaporated in order to adjust the viscosity to 30,000 cps. Then, a green sheet having a thickness of 1 mm was formed through use of a doctor blade, and two circular sheets having a diameter of 160 mm were cut from the green sheet. A bipolar electrode was printed on one circular sheet for the insulating dielectric layer by means of screen printing and through use of tungsten paste, such that concentric electrodes that constitute the bipolar electrode were formed with a spacing of 2.5 mm therebetween. Also, holes each having a diameter of 2 mm were formed in the center portion of the other green sheet for the insulator layer. The holes serve as a portion for supplying electricity to the electrode.

The green sheet having the holes was superposed on the green sheet having the printed electrode, and compressed under a pressure of 30 kg/cm² through use of a press heated to 100° C. Subsequently, the compressed sheet was sintered at 1650° C. in a mixed gas atmosphere containing 15 vol. % hydrogen and 85 vol. % nitrogen. Opposite surfaces of the resultant sintered body were polished in order to prepare an electrostatic attraction portion having a thickness of 1 mm. The volume resistivity of the electrostatic attraction portion measured at 25° C. was $2 \times 10^{11}$ $\Omega \cdot cm$. No fine cracks, pores, or warpage was observed on the sintered ceramic layer.

Subsequently, portions of the tungsten electrodes exposed through the holes formed in the electrostatic attraction portion were plated with nickel and gold, respectively, and two lead wires were soldered to these portions through use of a solder having a melting point of 350° C. Thus, an electrostatic holding apparatus was manufactured.

Next, a silicon wafer having a diameter of 6 inches was placed on the electrostatic holding apparatus, and a voltage of DC ±1 kV was applied between the two lead wires while the wafer was maintained at 0° C. In this state, the electrostatic force of the electrostatic holding apparatus was measured by use of an electrostatic force tester. The result of the measurement indicates that the electrostatic holding apparatus generates an electrostatic force of 6 kg/cm², which is sufficiently strong for straightening correction to improve the flatness of the wafer. When the applied voltage was shut off, the electrostatic holding apparatus quickly followed so that the wafer could be removed immediately after the stoppage of application of the voltage.

Comparative Example

An electrostatic attraction portion was manufactured in the same manner as in Example, except that in place of $TiO_2$ and TiN, 5.5 parts by weight of titania ($TiO_2$) was added and mixed into 100 parts by weight of the mixture of 93 wt. % alumina powder, 4 wt. % silica powder, and 3 wt. % magnesia. The volume resistivity of the electrostatic attraction portion measured at 25° C. was $1 \times 10^{14}$ $\Omega \cdot cm$.

In order to evaluate the heat resistance, the electrostatic force of the electrostatic holding apparatus was measured by use of an electrostatic force tester, while the wafer was heated to 100° C. The measured electrostatic force was 1 kg/cm², which is insufficient for practical use. The response of the electrostatic attraction portion was slow.

The present invention is not limited to the above-described embodiment. The above-described embodiment is a mere example, and those having the substantially same structure as that described in the appended claims and providing the similar action and effects are included in the scope of the present invention.

What is claimed is:

1. An electrostatic holding apparatus for electrostatically attract an object when applied with a voltage, the apparatus comprising:

an electrode to be applied with the voltage; and an insulating dielectric layer covering the electrode, wherein the insulating dielectric layer is formed of a sintered body having a volume resistivity of $1 \times 10^8$ to $8 \times 10^{13}$ $\Omega \cdot cm$ at 25° C. and containing a high resistivity ceramic, 2.5 to 5 wt. % of titania ($TiO_2$) and 5 wt. % or less of titanium nitride (TiN), wherein the high resistivity ceramic has a volume resistivity of $1 \times 10^{14}$ $\Omega \cdot cm$ or higher at 25° C.

2. The electrostatic holding apparatus of claim 1, wherein the high resistivity ceramic is one or more ceramic materials selected from a group consisting of alumina, aluminum nitride, and zirconium oxide.

* * * * *